United States Patent
Gottlieb

(10) Patent No.: US 10,473,499 B2
(45) Date of Patent: Nov. 12, 2019

(54) SYSTEM AND METHOD OF METERING WITH ARRAY OF TRANSDUCERS

(71) Applicant: Cameron International Corporation, Houston, TX (US)

(72) Inventor: Emanuel John Gottlieb, Upper Saint Clair, PA (US)

(73) Assignee: Cameron International Corporation, Houston, TX (US)

( * ) Notice: Subject to any disclaimer, the term of this patent is extended or adjusted under 35 U.S.C. 154(b) by 0 days.

(21) Appl. No.: 15/815,429

(22) Filed: Nov. 16, 2017

(65) Prior Publication Data

US 2019/0145807 A1 May 16, 2019

(51) Int. Cl.
*G01F 1/66* (2006.01)
*H01L 41/113* (2006.01)
*G01P 5/24* (2006.01)
*H01Q 1/22* (2006.01)

(52) U.S. Cl.
CPC .......... *G01F 1/663* (2013.01); *H01L 41/1132* (2013.01); *H01Q 1/2233* (2013.01)

(58) Field of Classification Search
CPC ................ G01F 1/66; H01L 41/11; G01P 5/24
See application file for complete search history.

(56) References Cited

U.S. PATENT DOCUMENTS

| | | | |
|---|---|---|---|
| 3,564,912 A | 2/1971 | Malone et al. | |
| 4,109,523 A | 8/1978 | Teyssandier | |
| 4,300,400 A | 11/1981 | Bistrian, Jr. et al. | |
| 6,758,100 B2 | 7/2004 | Huang | |
| 7,380,438 B2 * | 6/2008 | Gysling | G01N 22/00 702/24 |
| 2005/0039520 A1 * | 2/2005 | Davis | G01F 1/7082 73/49.5 |
| 2005/0044966 A1 * | 3/2005 | Gysling | G01F 1/662 73/861.26 |
| 2005/0188771 A1 * | 9/2005 | Lund Bo | G01F 1/40 73/861 |
| 2017/0227568 A1 * | 8/2017 | Hies | G01P 5/245 |

FOREIGN PATENT DOCUMENTS

WO 2016145524 A1 9/2016

\* cited by examiner

*Primary Examiner* — Jewel V Dowtin
(74) *Attorney, Agent, or Firm* — Fletcher Yoder, P.C.

(57) ABSTRACT

A Doppler array flowmeter system that includes a phased array antenna coupled to a conduit. The phased array antenna includes a plurality of transducers that produce an acoustic beam by emitting a respective first acoustic signal. The transducers receive respective second signals, wherein the second signals are frequency shifted reflections of the first acoustic signals off of particulate in a fluid. A controller couples to the plurality of transducers and compares the first acoustic signals to the second signals to determine a volumetric flowrate of the fluid through a conduit.

20 Claims, 7 Drawing Sheets

SYSTEM AND METHOD OF METERING WITH ARRAY OF TRANSDUCERS

FIELD OF THE INVENTION

The present invention relates to flowmeters.

BACKGROUND

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Wells are often used to access resources below the surface of the earth. For instance, oil, natural gas, and water are often extracted via a well. Due to the value of these subsurface resources, wells are often drilled at great expense, and great care is typically taken to measure the amount of resources pumped out of the wells as well as the amount shipped/transported to customers.

BRIEF DESCRIPTION OF THE DRAWINGS

These and other features, aspects, and advantages of the present invention will become better understood when the following detailed description of certain exemplary embodiments is read with reference to the accompanying drawings in which like characters represent like parts throughout the drawings, wherein.

DETAILED DESCRIPTION OF SPECIFIC EMBODIMENTS

Figure 1:
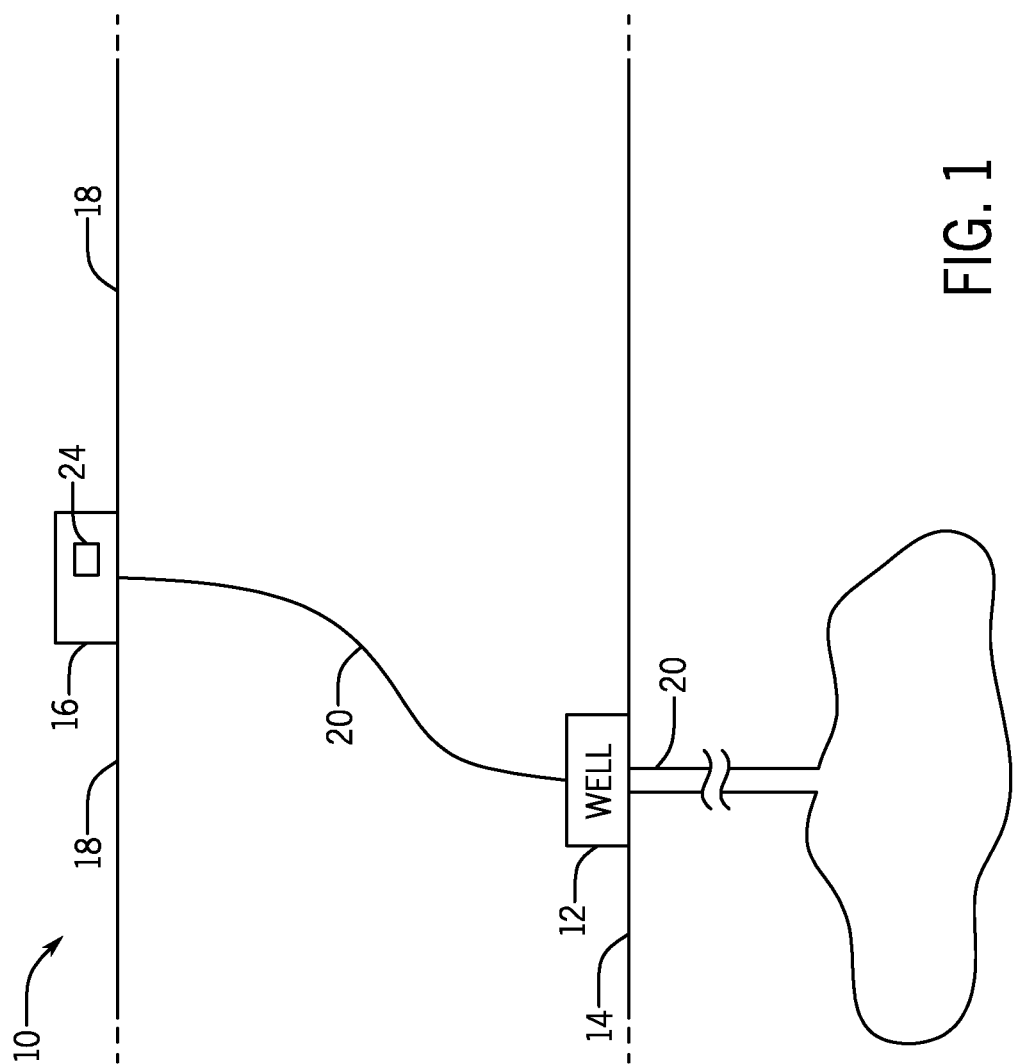
FIG. 1 is a block diagram of an embodiment of an exemplary resource extraction system.

One or more specific embodiments of the present invention will be described below. These described embodiments are only exemplary of the present invention. Additionally, in an effort to provide a concise description of these exemplary embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Moreover, the use of "top," "bottom," "above," "below," and variations of these terms is made for convenience, but does not require any particular orientation of the components.

Hydrocarbon fluids, such as oil and natural gas, are transported through a variety of conduits for processing and delivery to customers. For example, hydrocarbon fluids flow through conduits from underground reservoirs to rigs (e.g., land based rigs, open water rigs). After being pumped to the surface, additional conduits may carry the hydrocarbon fluids to a ship for transportation to a processing plant (e.g., refinery), or in conduits that transport the hydrocarbon fluids directly from a rig to a processing plant. The hydrocarbon fluids may then be refined and/or otherwise processed before delivery to customers through various pipelines, such as through natural gas lines.

Because hydrocarbon fluids are used so extensively for energy production, these conduits may carry significant amounts of hydrocarbon fluids. For example, the Trans Alaska Pipeline System may carry in excess of 20 million gallons of oil a day. Because so much oil is carried, small errors in flowrate measurement may translate into excess costs on the part of the producer or buyer depending on whose side the flowrate error favors. A ±2% error in calculating the flowrate for 20 million gallons/day may end up costing a producer compensation worth 400,000 gallons of oil per day or result in overcharging a customer for 400,000 gallons/day. Thus errors in measurement can result in financial losses. These losses may rapidly increase if the flowrate measurement has an accuracy less than ±2%.

The embodiments discussed below include a Doppler array flowmeter system capable of accurately measuring flow rates through a conduit using a phased array antenna. In some embodiments, the Doppler array flowmeter system is capable of measuring flowrates of hydrocarbon fluids with an accuracy of ±0.00%, ±0.50%, ±1.00%, ±1.50%. The accuracy of the Doppler array flowmeter system may therefore reduce potential losses. It should be understood that while the discussion above and below focuses on measuring flowrates of hydrocarbons in conduits, the Doppler array flowmeter system may also be used to measure other fluids such as drilling fluids. Drilling fluids are water based mud, gel based mud, and oil based mud. Drilling mud may include Barite and other additives.

FIG. 1 depicts an exemplary hydrocarbon resource extraction system 10 (e.g., subsea resource extraction system). The resource extraction system 10 may be used to extract oil, natural gas, and other related resources from a well 12, located on a subsea floor 14, to an extraction point 16 at a surface location 18. The extraction point 16 may be an on-shore processing facility, an off-shore rig, or any other extraction point. In order to retrieve these hydrocarbon fluids from underground reservoirs, the hydrocarbon fluids flow through various conduits including casings 20 (e.g., well casings) and from the well 12 to the extraction point 16 through flexible jumper or umbilical lines 22. Additional conduits may then deliver hydrocarbon fluids to ships as well as directly to processing plants and/or customers. The flowrate of hydrocarbon fluids through these conduits may be measured with a Doppler array flowmeter system 24 with an accuracy rate of ±0.00%, ±0.50%, ±1.00%, ±1.50%.

Figure 2:
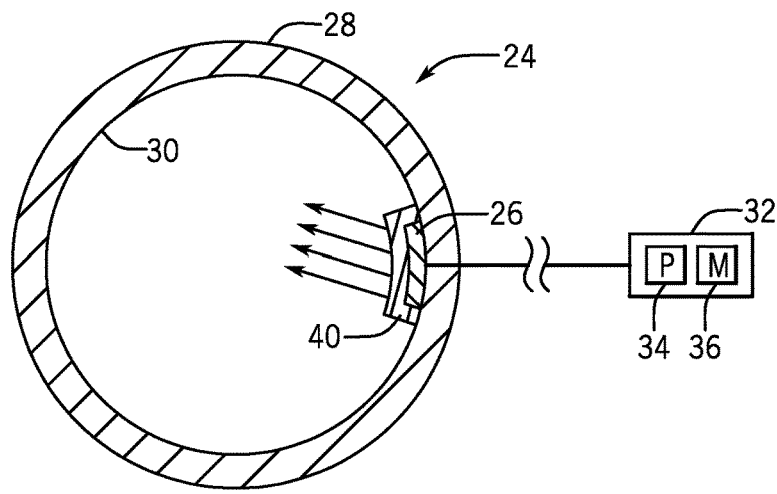
FIG. 2 is a cross-sectional view of an embodiment of a Doppler array flowmeter system.

FIG. 2 is a cross-sectional view of an embodiment of a Doppler array flowmeter system 24. The Doppler array flowmeter system 24 includes a phased array antenna 26 that rests within a conduit 20. For example, the phased array antenna 26 may couple to an interior surface 30 of the conduit 28. In operation, the phased array antenna 26 generates ultrasonic acoustic signals (i.e., waves) that reflect off of particulate flowing in the fluid (e.g., acoustic waves, sound waves). The phased array antenna 26 receives the reflected frequency shifted ultrasonic acoustic signals (i.e., waves) and transmits them as electronic signals to a controller 32 for processing. In order to process the signals, the controller 32 include one or more processors 34 and memories 36 for processing signals to determine a volumetric flow rate of the fluid through the conduit 28.

Because the phased array antenna 26 rests within the conduit 28, the phased array antenna 26 is exposed to the hydrocarbon fluid flow as well as particulate in the hydrocarbon fluid flow. To protect the phased array antenna 26, a protective structure 40 (e.g., coating and/or housing) may cover/surround the phased array antenna 26 thus protecting the phased array antenna from corrosion, erosion, etc. The protective coating 40 may also facilitate accuracy of the phased array antenna 26 by acoustically isolating the transducers in the phased array antenna 26. This may reduce acoustic noise which may interfere with the accuracy of the phased array antenna 26. For example, the protective structure 40 may be a polyether ether ketone (PEEK) plastic, polyimide based plastic or another type of high strength plastic which may reduce/block acoustic noise as well as contact between the fluid and the phased array antenna 26.

Figure 3:
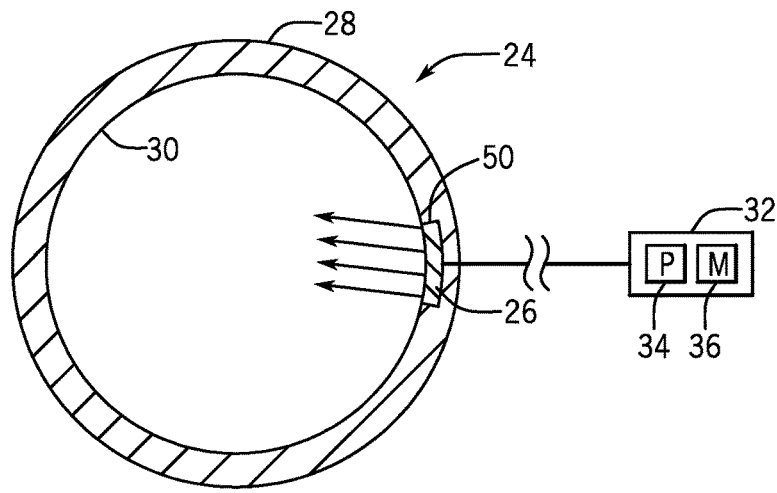
FIG. 3 is a cross-sectional view of an embodiment of a Doppler array flowmeter system.

FIG. 3 is a cross-sectional view of an embodiment of a Doppler array flowmeter system 24. Instead of resting on an interior surface 30 of the conduit 28, the conduit 28 defines a recess 50 that receives the phased array antenna 26. As illustrated, the recess 50 enables placement of the phased array antenna 26 outside of a fluid flow path through the conduit 28. For example, the phased array antenna 26 may be recessed below and/or flush with the interior surface 30 of the conduit 28. In this way, the conduit 28 may reduce contact between particulate in the hydrocarbon fluid and the phased array antenna 26. In some embodiments, the phased array antenna 26 may still include a protective coating and/or housing 40 despite being placed in the recess 50. As explained above, the protective coating and/or housing 40 protects the phased array antenna 26 from particulates in the fluid and/or the fluid itself. The protective coating 32 may also facilitate accuracy of the phased array antenna 26 by acoustically isolating transducers in the phased array antenna 26 from acoustic noise within and external to the conduit 28, which may interfere with the accuracy of the phased array antenna 26.

Figure 4:
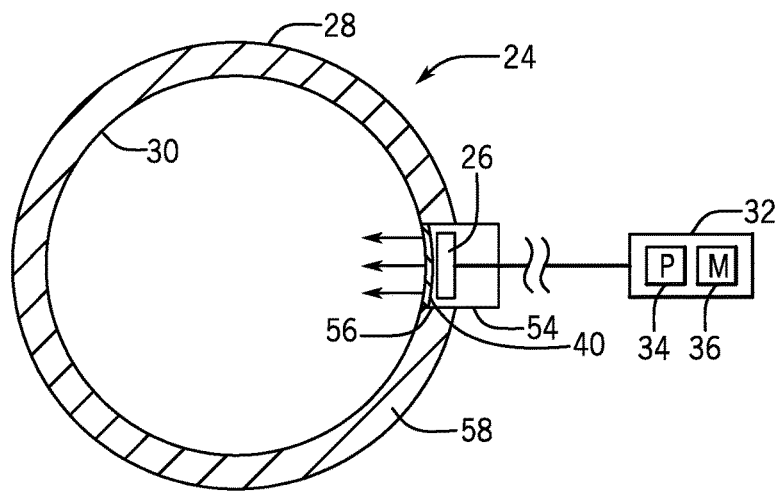
FIG. 4 is a cross-sectional view of an embodiment of a Doppler array flowmeter system.

FIG. 4 is a cross-sectional view of an embodiment of a Doppler array flowmeter system 26. In FIG. 4, the Doppler array flowmeter system 26 includes a housing 54 that contains the phased array antenna 26. In operation, the housing 54 protects the phased array antenna 26 from the hydrocarbon fluid as well as particulate flowing through the conduit 28. As illustrated, the phased array antenna 26 may rest within an aperture 56 defined by the wall 58 of the conduit 28. In some embodiments, the housing 42 (e.g., annular housing with external threads) may threadingly couple to the conduit 28 (e.g., annular aperture 56 with internal threads) to the annular to secure the phased array antenna 26 in place. In addition to protecting the phased array antenna 26, the housing 54 may also facilitate accuracy of the phased array antenna 26 by acoustically isolating transducers in the phased array antenna 26. In other words, the housing 54 may reduce acoustic noise which may interfere with the accuracy of the phased array antenna 26.

Figure 5:
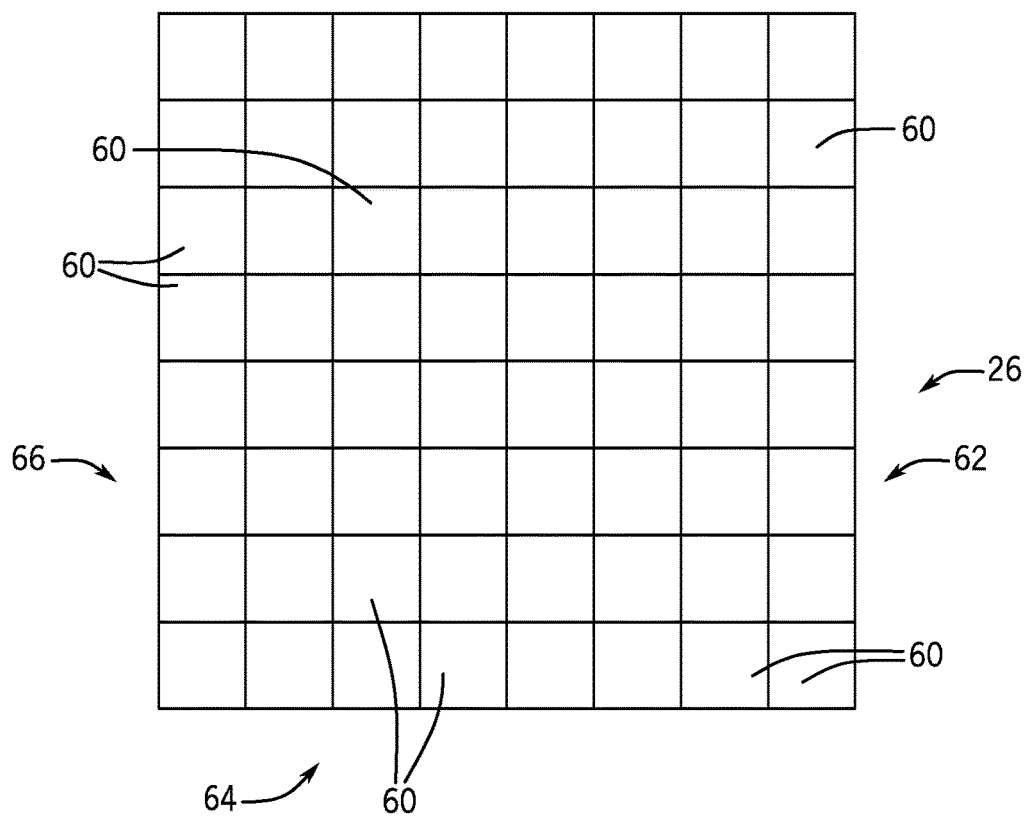
FIG. 5 is a front view of an embodiment of a phased array antenna.

FIG. 5 is a front view of an embodiment of a phased array antenna 26. The phased array antenna 26 includes a plurality of piezoelectric transducers 60 arranged in an array 62 of columns 64 and rows 66. The piezoelectric transducers 60 may be arranged in the array 62 so that the pitch between the different piezoelectric transducers 60 is less than half a wavelength. Depending on the application, the number of piezoelectric transducers 60 in the array 62 may be scaled up or down depending on power requirements. For example, if the Doppler array flowmeter system 26 is placed within a large conduit 28, additional transducers 60 may facilitate accurate measurement of the volumetric flow rate through the conduit 28 by increasing the power of the phased array antenna 26 (i.e., increasing strength of the waves). However, if the conduit 28 is small, a smaller array 60 may provide sufficient power to measure the flow rate through the conduit 28. As illustrated, the phased array antenna 26 includes eight columns 64 and eight rows 66 for a total of 64 piezoelectric transducer 60. However, the phased array antenna 26 may be scaled up such that the number of columns 64 and rows 66 may be equal or different. Moreover, the number of columns 64 and rows 66 may be any integer value from 1 to 1000 with the corresponding numbers of piezoelectric transducers 60.

Figure 6:
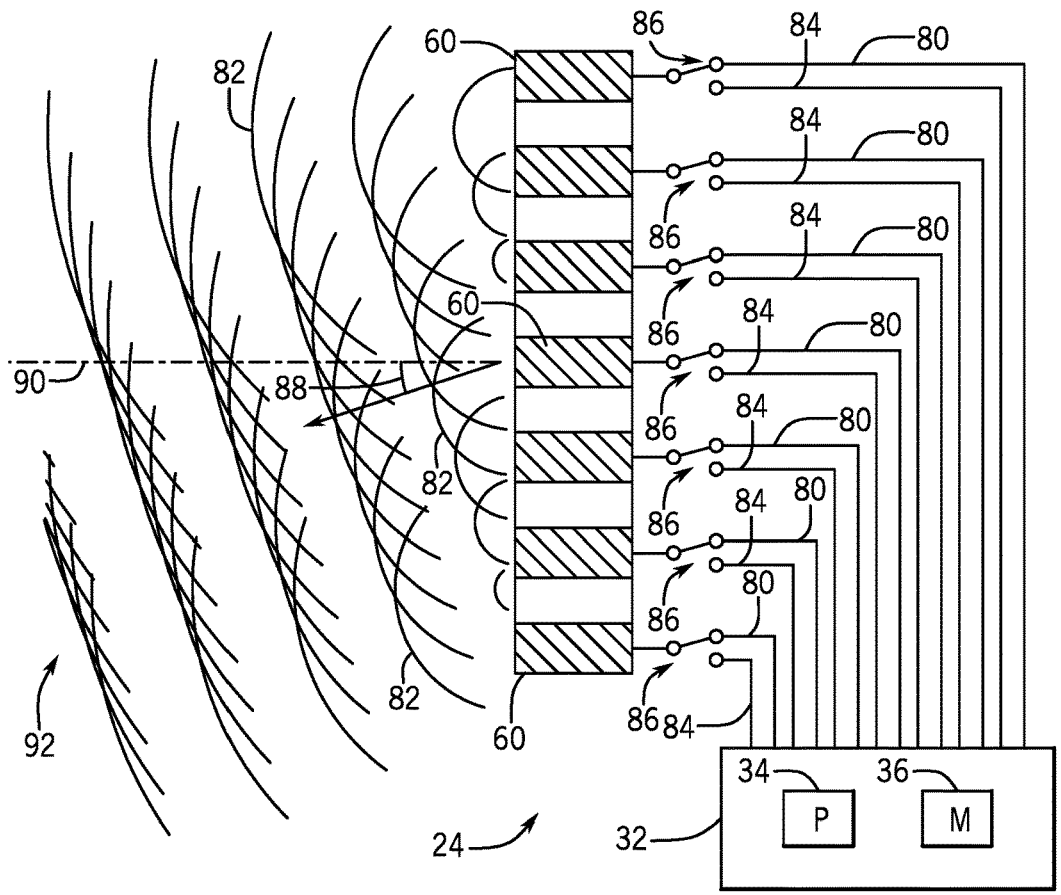
FIG. 6 is a cross-sectional view of an embodiment of a phased array antenna in operation.

FIG. 6 is a cross-sectional view of an embodiment of a phased array antenna 26 in operation. As explained above, the phased array antenna 26 uses the piezoelectric transducers 60 to emit ultrasonic waves and then receives the frequency shifted ultrasonic waves after they reflect off of particulate in the fluid flow. The controller 34 electrically couples to each of the piezoelectric transducers 60 enabling the controller 34 to send and receive electrical signals with the piezoelectric transducers 60. More specifically, the controller 34 produces an electrical signal for each piezoelectric transducer 60 that travels through respective first electrical pathways 80 (e.g., wires). The piezoelectric transducers 60 receive the electrical signals and in response produces an ultrasonic acoustic wave 82 as the piezoelectric transducers 60 mechanically deforms. The emitted ultrasonic acoustic waves 82 then travel through the fluid until they contact particulate in the fluid flow. The particulate act as reflectors that reflect the ultrasonic acoustic wave 82 back to the piezoelectric transducers 60. The reflected waves in turn cause mechanical deformation of the piezoelectric transducers 60. As the piezoelectric transducers 60 deform, they generate an electrical signal that passes through a second electrical pathway 84 to the controller 34. The controller 34 then uses the transmitted and received electrical signals to calculate a velocity vector at a specific point in the fluid flow.

In order to transmit and receive these electrical signals, the Doppler array flowmeter system 24 may include a switch 86 that continuously switches between the first electrical pathway 80 and the second electrical pathway 84 as the piezoelectric transducers 60 emit and receive the ultrasonic waves.

In some embodiments, the controller 34 is able to electronically steer the direction of the waves in multiple planes 82 by timing actuation of the piezoelectric transducer 60. As illustrated in FIG. 6, the piezoelectric transducers 60 emit ultrasonic waves 82 at different times. As the ultrasonic waves 82 contact each other the ultrasonic waves 82 add together in the desired direction (i.e., superimpose) while canceling out and/or reducing in strength in undesired directions. The constructive and destructive interferences of the waves 82 forms an ultrasonic beam 92 that can then be steered by the controller 32. That is, the angle of the ultrasonic beam 92 may be moved through an angle 88 from the axis 90 of the phased array antenna 26. As the controller 32 steers the ultrasonic beam 92, the controller 32 receives feedback regarding the velocity and direction of the fluid flow through the conduit 28 enabling accurate calculation of a volumetric flow rate.

Figure 7:
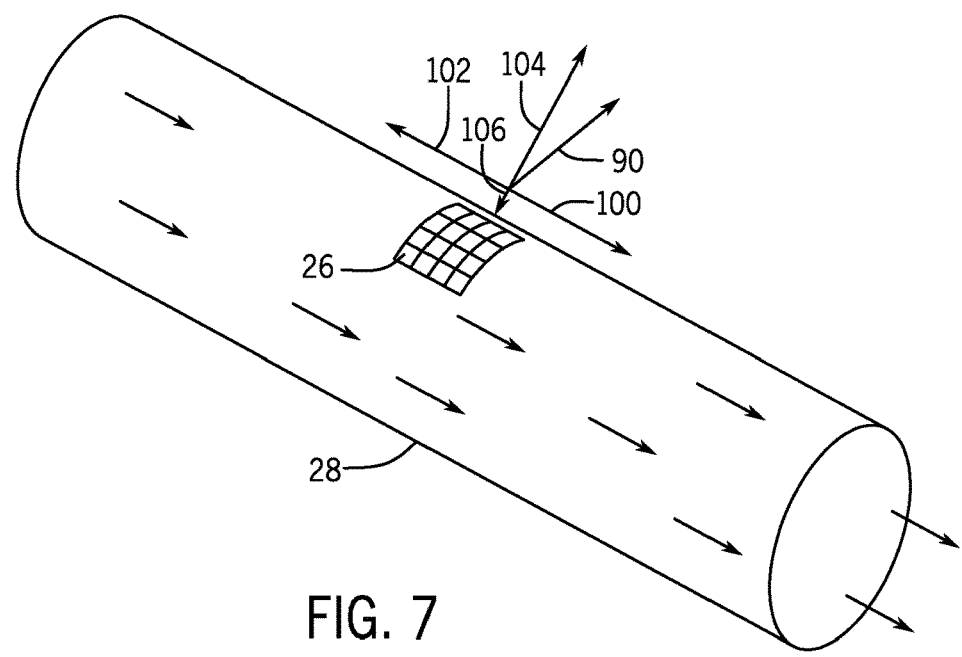
FIG. 7 is a perspective view of an embodiment of a phased array antenna within a conduit.

FIG. 7 is a perspective view of an embodiment of a phased array antenna 26 within a conduit 28. As explained above, the controller 32 is capable of electronically steering an ultrasonic beam 92 produced by the piezoelectric transducers 60. The steering may be done both longitudinally in axial directions 100 and 102 as well as transversely in axial directions 104 and 106, with respect to the axis 90 of the phased array antenna 26.

Figure 8:
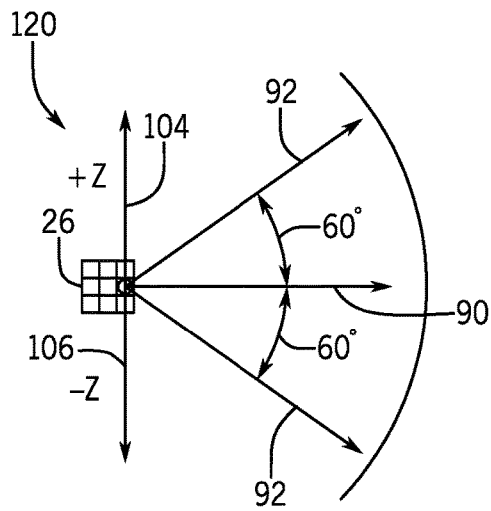
FIG. 8 is a graph of an embodiment illustrating the ability of a phased array antenna to change the direction of an ultrasonic beam in an elevation plane.

FIG. 8 is a graph 120 of an embodiment illustrating the ability of the controller 34 to electronically control the direction of the ultrasonic beam 92. More specifically, FIG. 8 illustrates traverse movement of the ultrasonic beam 92 with respect to the axis 90 of the phased array antenna 26. In some embodiments, the controller 34 may electronically steer the ultrasonic beam 92 ±60° or more from the axis 90 of the phased array antenna 26 (e.g., at least equal to or greater than ±1, 2, 3, 4, 5, 10, 15, 20 degrees, etc.).

Figure 9:
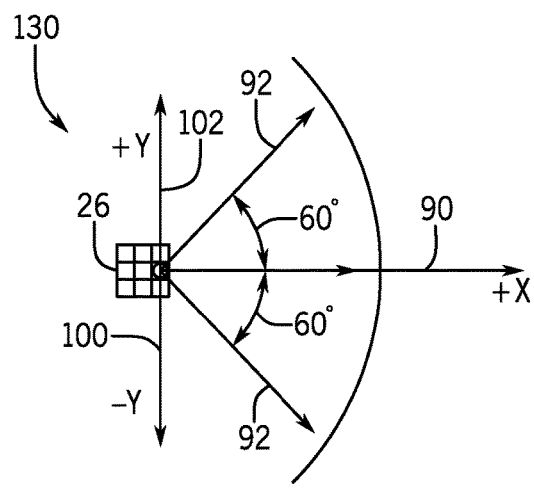
FIG. 9 is a graph of an embodiment illustrating the ability of a phased array antenna to change the direction of the ultrasonic beam in a longitudinal plane.

FIG. 9 is a graph 130 of an embodiment illustrating the ability of the controller 34 to electronically control the direction of the ultrasonic beam 92 longitudinally with respect to the axis 90 of the phased array antenna 26. In some embodiments, the controller 34 may electronically move the ultrasonic beam 92 ±60° or more from the axis 90 of the phased array antenna 26 longitudinally between axial directions 100 and 102 (e.g., at least equal to or greater than ±1, 2, 3, 4, 5, 10, 15, 20 degrees, etc.). The ability to move the ultrasonic beam 92 of the phased array antenna 26 enables the controller 34 to collect multiple velocity vectors used in calculating a volumetric flow rate. For example, if the controller 34 electronically steers the ultrasonic beam 92 over an angular range of 120° (i.e., ±60°) or more in the longitudinal direction and over an angular range of 120° (i.e., ±60°) or more in the transverse direction, the controller receives 14,400 velocity vectors (i.e., 120×120=14,400) enabling the controller 34 to accurately determine a volumetric flow rate. In other words, the controller 34 receives sufficient velocity vectors to enable computational fluid dynamics to determine the volumetric flow rate through the conduit 28 without using Gaussian integration of a limited number of velocity vectors. In this way, the Doppler array flowmeter system 24 enables accurate volumetric flowrate calculations with an accuracy rate of ±0.00%, ±0.50%, ±1.00%, ±1.50%.

In some embodiments, the angular range may be less, such as 60° (i.e., ±30°) in the longitudinal direction and 60° (i.e., ±30°) in the transverse direction, thus generating 3,600 velocity vectors (i.e., 60×60=3,600). In still another embodiment, the angular range in the transverse direction may be greater than the longitudinal direction or vice versa. For example, the controller 34 may electronically steer the ultrasonic beam 60° (i.e., ±30°) in the longitudinal direction and 30° (i.e., ±15°) in the transverse direction.

Figure 10:
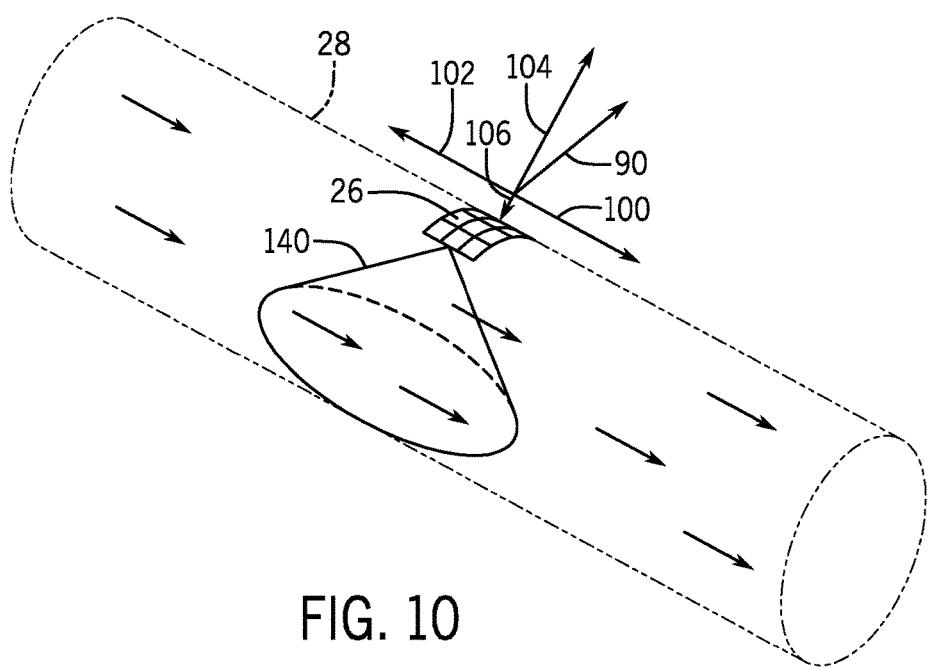
FIG. 10 is a perspective view of an embodiment of a volume monitored by a Doppler array flowmeter system to determine a volumetric flow rate through a conduit.

FIG. 10 is a perspective view of an embodiment of a volume 140 monitored by a Doppler array flowmeter system 24. The volume 140 is formed by moving the ultrasonic beam 92 formed by the phased array antenna 26 in the traverse (i.e., axis 104, 106) and longitudinal directions (i.e., axis 100 and 102) forming a cone/pyramid shaped monitored volume 140.

Figure 11:
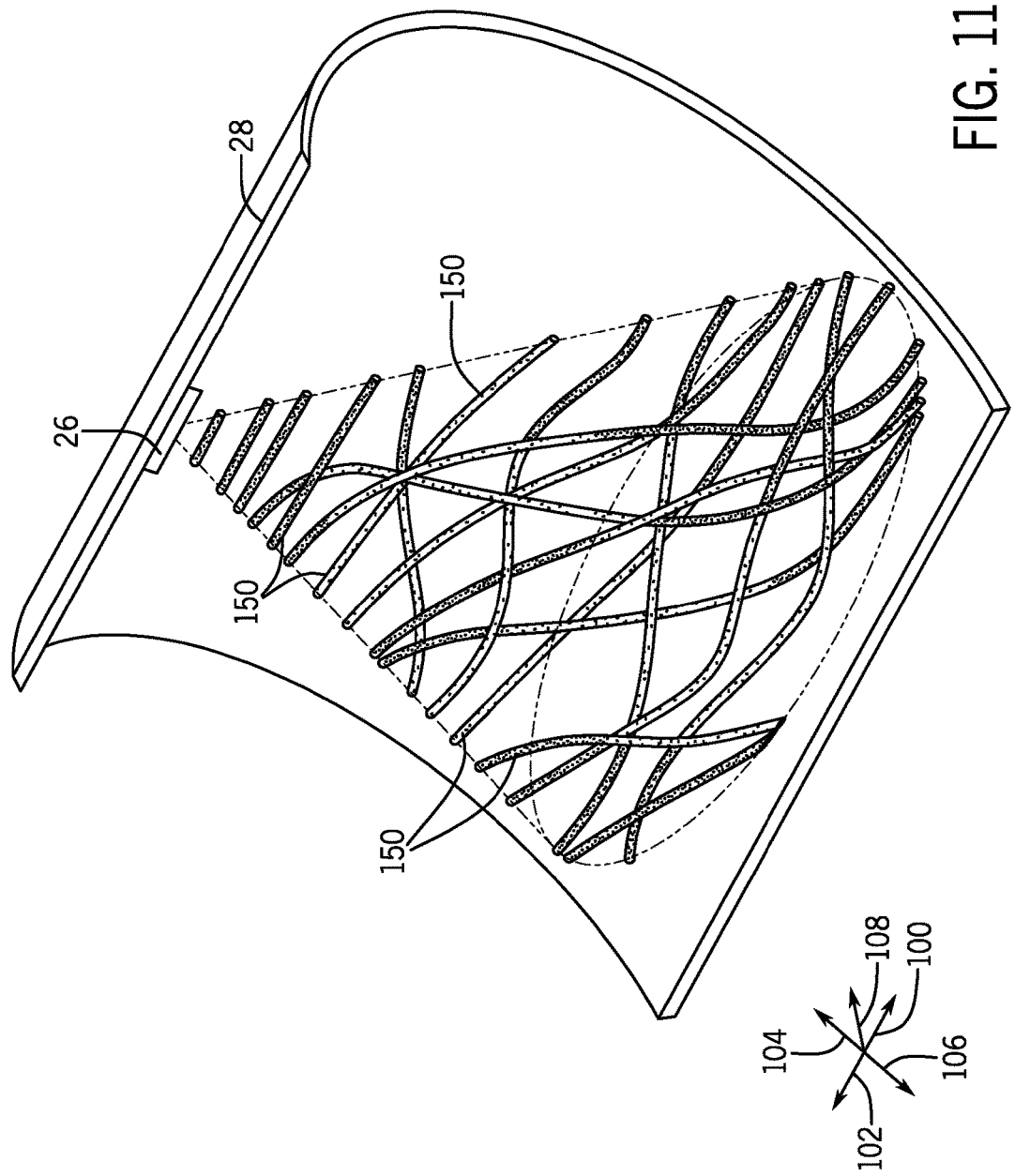
FIG. 11 is a perspective view of an embodiment illustrating the Doppler array flowmeter system detecting flow patterns within a conduit.

FIG. 11 is a perspective view of a visual depiction of the volume 140 using the Doppler array flowmeter system 24. As illustrated, the Doppler array flowmeter system 24 is a capable of determining not only speed of the fluid but also how the fluid changes direction within the monitored volume, in other words velocity vectors 150. As explained above, the ability to calculate 14,400 or more velocity vectors enables the Doppler array flowmeter system 24 to accurately determine volumetric flowrate within the conduit 28 without using Gaussian integration. The velocity vectors are able to display flow phenomena like laminar flow, turbulent flow, and swirl (rotational flow).

Figure 12:
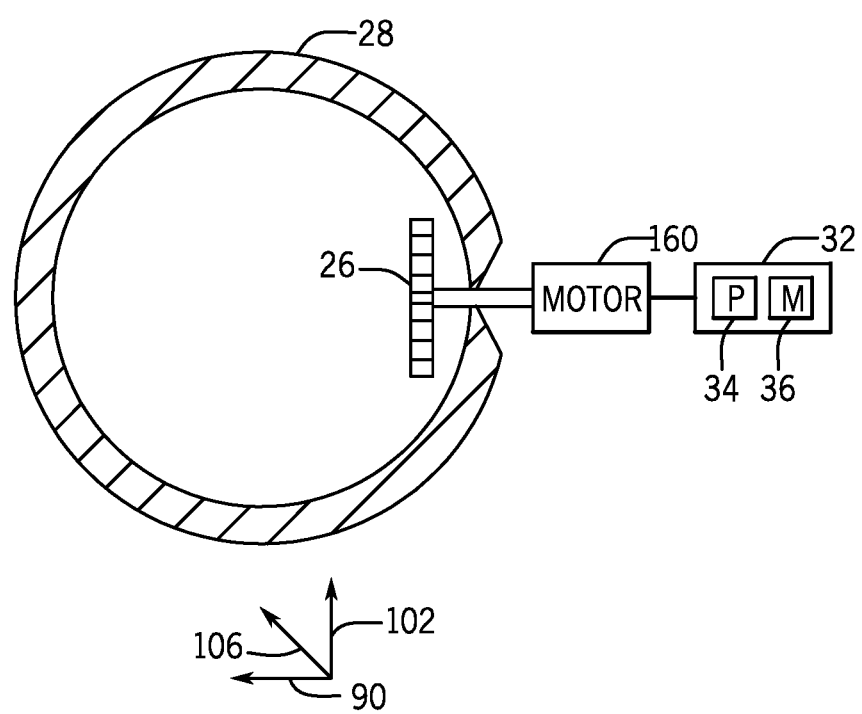
FIG. 12 is a cross-sectional view of an embodiment of a Doppler array flowmeter system.

FIG. 12 is a cross-sectional view of an embodiment of a Doppler array flowmeter system 24. In some embodiments, the Doppler array flowmeter system 24 may use physical steering of the phased array antenna 26 to move the ultrasonic beam 92 instead of electronic steering. For example, the phased array antenna 26 may couple to a motor 160 that receives motion control signals from the controller 32. These signals control operation of the motor 106 which in turn moves the phased array antenna 26. The motor 106 may move the phased array antenna 26 in both the transverse (i.e., axis 104, 106) and longitudinal directions (i.e., axis 100, 102). For example, the motor 106 may move the phased array antenna 26 over an angular range of 120° in the transverse direction and over an angular range of 120° in the longitudinal direction in order to gather 14,400 velocity vectors that enable accurate volumetric flowrate calculation. In some embodiments, the angular range may be less, such as 60° (i.e., ±30°) in the longitudinal direction and 60° (i.e., ±30°) in the transverse direction, thus generating 3,600 velocity vectors (i.e., 60×60=3,600). In still another embodiment, the angular range in the transverse direction may be greater than the longitudinal direction or vice versa. For example, the controller 34 may move the phased array antenna 26 60° (i.e., ±30°) in the longitudinal direction and 30° (i.e., ±15°) in the transverse direction.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The invention claimed is:

1. A system, comprising:
   a Doppler array flowmeter system, comprising:
      a conduit configured to carry a fluid;

a phased array antenna coupled to the conduit, wherein the phased array antenna comprises a plurality of piezoelectric transducers configured to produce an ultrasonic beam by emitting a respective first ultrasonic signal, and wherein the piezoelectric transducers are configured to receive respective second signals, wherein the second signals are frequency shifted reflections of the first ultrasonic signals off of particulate in the fluid; and a controller coupled to the plurality of piezoelectric transducers, wherein the controller is configured to compare the first ultrasonic signals to the second signals to determine a volumetric flowrate of the fluid through the conduit.

2. The system of claim 1, wherein the phased array antenna comprises a two-dimensional grid of at least eight rows of piezoelectric transducers by eight columns of piezoelectric transducers.

3. The system of claim 1, wherein the phased array antenna couples to an interior surface of the conduit.

4. The system of claim 1, wherein the phased array antenna is disposed within a recess in the conduit.

5. The system of claim 1, comprising a housing coupled to the conduit, wherein the phased array antenna is disposed within the housing.

6. The system of claim 1, comprising a protective structure disposed at least partially about the phased array antenna, wherein the protective structure is configured to protect the phased array antenna from the fluid flowing through the conduit.

7. The system of claim 1, wherein the controller is configured to change a direction of the ultrasonic beam through one or more planes.

8. The system of claim 7, wherein the controller electronically controls the direction of the ultrasonic beam by controlling actuation of the plurality of the piezoelectric transducers to emit the first ultrasonic signals at a plurality of different times.

9. The system of claim 7, wherein the controller controls the direction of the ultrasonic beam by physically moving the phased array antenna.

10. A system, comprising:
a Doppler array flowmeter system, comprising:
a phased array antenna coupled to a conduit, wherein the phased array antenna comprises a plurality of transducers configured to produce an acoustic beam by emitting a respective first acoustic signal, wherein the transducers are configured to receive respective second signals, and wherein the second signals are phase shifted reflections of the first acoustic signals off of particulate in a fluid; and a controller coupled to the plurality of transducers, wherein the controller is configured to compare the first acoustic signals to the second signals to determine a volumetric flowrate of the fluid through a conduit.

11. The system of claim 10, wherein the phased array antenna comprises a two-dimensional grid of at least eight rows of transducers by eight columns of transducers.

12. The system of claim 10, wherein the controller is configured to move the acoustic beam through one or more planes and axes.

13. The system of claim 10, wherein the phased array antenna rests within a recess in the conduit.

14. The system of claim 10, comprising a housing coupled to the conduit, wherein the phased array antenna rests within the housing.

15. The system of claim 10, comprising a protective layer coupled to the phased array antenna, wherein the protective layer is configured to protect the phased array antenna from the fluid flowing through the conduit.

16. A method of determining a volumetric flowrate using a Doppler array flowmeter system, comprising:
generating an acoustic beam with a phased array antenna by emitting first signals from respective transducers;
receiving second signals with the transducers, wherein the second signals are phase shifted reflections of the first signals off of particulate in a fluid flow; and
comparing the first signals to the second signals to calculate a volumetric flow rate.

17. The method of claim 16, comprising moving the acoustic beam in one or more planes and axes.

18. The method of claim 16, wherein moving the acoustic beam comprises moving the acoustic beam through ±60° in a first plane.

19. The method of claim 16, wherein moving the acoustic beam comprises moving the acoustic beam through ±60° in a second plane.

20. The method of claim 16, comprising physically moving the phased array antenna through one or more planes with a motor.

* * * * *